United States Patent
Chen et al.

[19]

[11] Patent Number: 6,050,218
[45] Date of Patent: Apr. 18, 2000

[54] DOSIMETRY CUP CHARGE COLLECTION IN PLASMA IMMERSION ION IMPLANTATION

[75] Inventors: Jiong Chen, Beverly; Peter Kellerman, Essex; A. Stuart Denholm, Lincoln, all of Mass.

[73] Assignee: Eaton Corporation, Cleveland, Ohio

[21] Appl. No.: 09/162,096

[22] Filed: Sep. 28, 1998

[51] Int. Cl.$^7$ .................................................. C23C 16/00
[52] U.S. Cl. ...................... 118/723 E; 118/712; 118/715; 156/345
[58] Field of Search ............................ 156/345; 118/712, 118/723 E, 723 ER, 715

[56] References Cited

U.S. PATENT DOCUMENTS

| | | | |
|---|---|---|---|
| 4,539,217 | 9/1985 | Farley . | |
| 4,587,433 | 5/1986 | Farley . | |
| 4,744,938 | 5/1988 | Ruddy ..................................... | 376/153 |
| 4,764,394 | 8/1988 | Conrad . | |
| 5,654,043 | 8/1997 | Shao et al. . | |
| 5,658,423 | 8/1997 | Angell et al. . | |
| 5,728,253 | 3/1998 | Saito et al. .............................. | 156/345 |
| 5,814,823 | 9/1998 | Benveniste ......................... | 250/492.21 |
| 5,883,931 | 3/1999 | Adibi et al. ........................ | 250/492.21 |

OTHER PUBLICATIONS

D.M. Jamba, "Dosimetry Measurement In Ion Implanters", Nuclear Instruments and Methods 189 pp. 253–263, North–Holland Publishing Company (1981).

C.M. McKenna, " High Current Dosimetry Techniques" Radiation Effects, vol. 44, pp. 93–110, (1979).

D.M. Jamba, Semiconductor Measurement Technology: Some Aspects of Dose Measurement For Accurate Ion Implantation, NBS Special Publication 400–39, pp. 1–36 (Issued Jul. 1977).

D.M. Jamba, "Secondary Particle Collection In Ion Implantation Dose Measurement" Rev. Sci. Instrum., vol. 49, No. 5, pp. 634–638 (May 1978).

E.P.EerNisse, G.D. Peterson, and D.G. Schueler "Ion Beam Profile Monitor" Rev. Sci. Instrum., vol. 46, No. 3 pp. 266–268 (Mar. 1975).

*Primary Examiner*—Richard Bueker
*Assistant Examiner*—Erin Fieler
*Attorney, Agent, or Firm*—Watts, Hoffmann, Fisher & Heinke

[57] ABSTRACT

Method and apparatus for causing ions to impact a workpiece implantation surface. A process chamber defines a chamber interior into which one or more workpieces can be inserted for ion treatment. An energy source sets up an ion plasma within the process chamber. A support positions one or more workpieces within an interior region of the process chamber so that an implantation surface of the one or more workpieces is positioned within the ion plasma. A pulse generator in electrical communication with the workpiece support applies electrical pulses for attracting ions to the support. One or more dosimetry cups including an electrically biased ion collecting surface are disposed around the workpiece support to measure implantation current. An implantation controller monitors signals from the one or more dosimetry cups to control ion implantation of the workpiece.

17 Claims, 3 Drawing Sheets

DOSIMETRY CUP CHARGE COLLECTION IN PLASMA IMMERSION ION IMPLANTATION

FIELD OF THE INVENTION

The present invention concerns a charge dosage monitoring system for use with a workpiece treatment system that uses charged ions for treating a workpiece. One such system immerses one or more silicon wafers in an ion plasma having a high density of positively charged ions that are then accelerated against the surface of the wafers to implant a controlled concentration of the ions into the wafers.

BACKGROUND ART

U.S. Pat. No. 4,764,394 to Conrad entitled "Method and Apparatus for Plasma Source Ion Implantation" discloses an ion implantation system for treating a target by means of ionic bombardment. Ion implantation into surfaces of a three dimensional target is achieved by forming an ionized plasma about the target within an enclosing chamber. Once the plasma is set up in a region surrounding the target, ions from the plasma are driven into the target object from all sides without need to manipulate the target. This implantation is accomplished by application of repetitive pulses of high voltage, typically ten kilovolts or less, that cause the ions to be driven into the exposed surfaces of the target. A technique discussed in the '394 patent for setting up the plasma is to introduce a neutral gas into the region of the target and then ionize the gas with ionizing radiation.

The system disclosed in the '394 patent to Conrad uses an ion source to create an ion plasma in a region surrounding a workpiece and then selectively pulses an electrode that supports the workpiece thereby attracting the positive ions in the plasma toward the workpiece.

U.S. Pat. No. 5,654,043 to Shao et al. also concerns a system for treating a workpiece surface by causing ions to impact the workpiece surface. A gas is injected into an implantation chamber so that an ionizable gas occupies a region in close proximity to the workpiece surface. A plasma of implantation material is created within the interior region of the implantation chamber by repeatedly relatively biasing conductive electrodes with a sequence of pulses that both ionize the gas molecules injected into the chamber and accelerate the ionized gas molecules toward the implantation surfaces of the one or more workpieces. The disclosure of the '043 patent to Shao et al. is incorporated herein by reference.

A paper entitled "Dosimetry Measurement in Ion Implanters" copyright 1981 by Douglas M. Jamba discloses the use of a dosimetry cup to collect charges impacting a target during ion beam implantation. To more accurately measure the charge actually impacting the target, a biasing electrode located between a beam defining aperture and the entrance to the cup is used to suppress electrons and negative ions that are trying to leave the cup. The biasing electrode also suppresses electrons generated on the defining aperture that are trying to enter the cup, and repels electrons that are carried with the ion beam.

A paper entitled "High Current Dosimetry Techniques" copyright 1979 by C. M. McKenna discloses use of one or more dosimetry cups located adjacent to the target for in-situ measurements of the charge bombarding the target during ion beam implantation. Measurements made by such dosimetry cups are used to control the ion beam being used for implantation. McKenna further discloses a negatively biased cup collector surface used in conjunction with less negatively biased cup walls to repel unwanted electrons from entering the cup. However, McKenna's experiments showed that this type of electrical biasing caused eruptions on the silicon target due to electrical discharges aggravated by secondary electrons trapped on the magnetic field lines within the dosimetry cup.

DISCLOSURE OF THE INVENTION

The present invention concerns a device for measuring the quantity of ions which are impacting a workpiece during ion implantation. Specifically, the present invention concerns a dosimetry cup adapted for use in a plasma immersion ion implantation system for causing ions to impact a workpiece implantation surface. Generally, the ion implantation system is made up of a process chamber into which one or more workpieces can be inserted for ion treatment and an energy source for setting up an ion plasma within the process chamber. A workpiece support positions at least one workpiece within the process chamber so that an implantation surface of the workpiece is located within the ion plasma. A pulse generator applies electrical pulses to the workpiece support to attract ions to the support.

To measure the concentration of ions which are impacting the workpiece implantation surface, one or more dosimetry cups are disposed near the workpiece. Each dosimetry cup has an electrically biased ion collecting surface for collecting ions from the plasma as other ions from the plasma are implanted into the workpiece.

An electrical bias on the ion collecting surface prevents ions present in the plasma from moving into the dosimetry cup during a time interval in between the electrical pulses which accelerate ions into the workpiece implantation surface. By preventing ions from moving into the dosimetry cup at times when ions are not being accelerated into the workpiece, the accuracy of the dosimetry measurement is improved.

Another feature of the present invention is the use of an electrically biased electrode which defines an entrance aperture through which ions enter the dosimetry cup. The electrically biased electrode repels electrons created at the ion collecting surface. The aperture located in the electrode is sized according to the plasma sheath thickness at the electrically biased electrode.

Structure of an exemplary embodiment of the present invention avoids errors in dose measurement caused by displacement current. This displacement current is generated when the workpiece support is charged by the high voltage pulse. The collector plate is imbedded in the workpiece support and current measured by the collector plate is returned to the workpiece support, not ground. In addition, signals are extracted from the dosimetry cup by means of high band-width fiber optics, protecting against stray capacitance entering the measurement circuit. By isolating the dosimetry cup from the workpiece support in this manner, errors introduced by this current are eliminated.

BRIEF DESCRIPTION OF THE DRAWINGS

FIG. 1a is an elevation view of a wafer support;

FIG. 1b is a top plan view of the wafer support depicted in FIG. 1a.

BEST MODE FOR PRACTICING THE INVENTION

Figure 1:
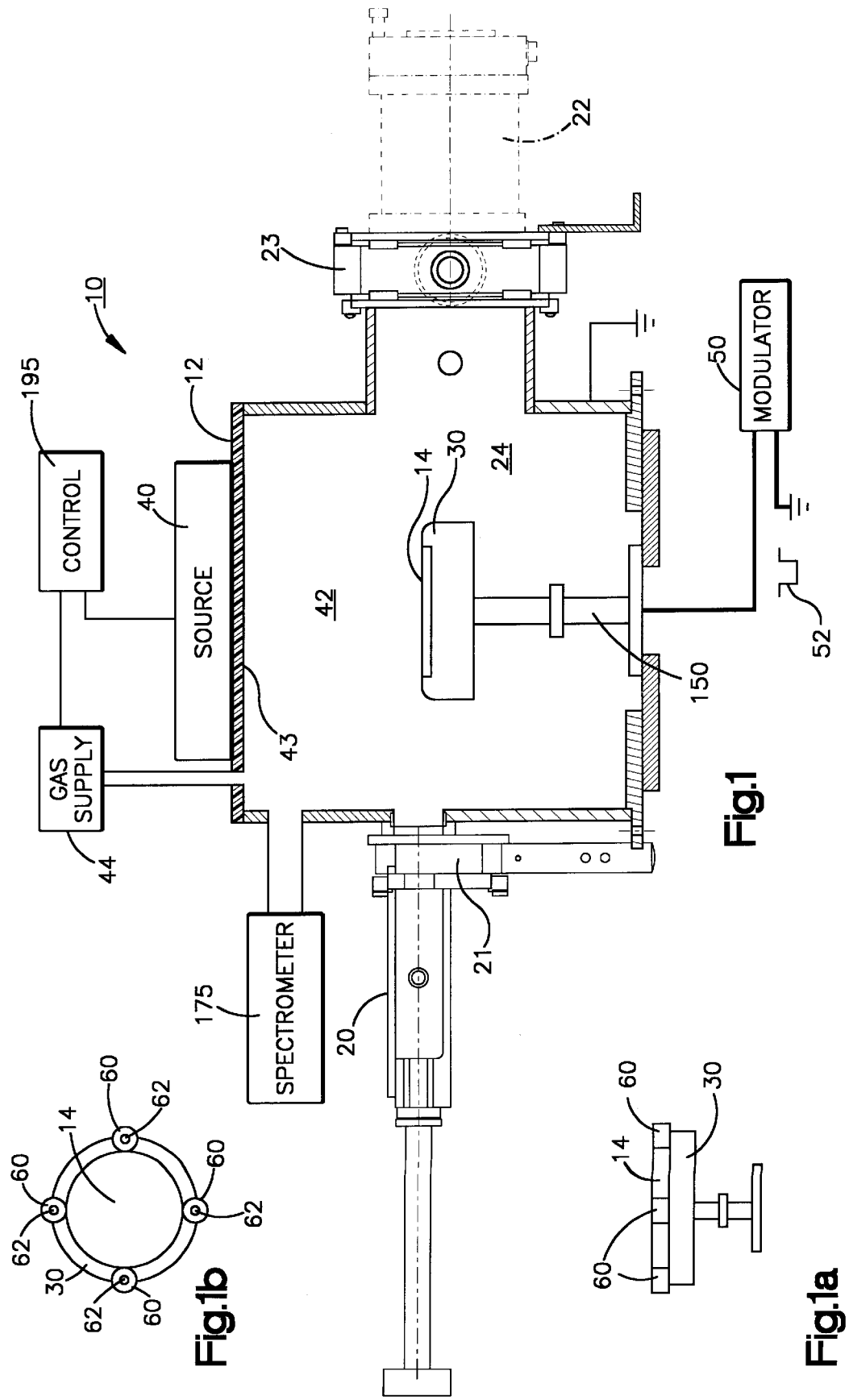
FIG. 1 is a schematic depiction of an ion implantation system constructed in accordance with the present invention.

FIGS. 1, 1a, and 1b depict an ion implantation system 10 which incorporates the present invention. The implantation system 10 includes a generally cylindrical plasma chamber 12 into which one or more generally planar workpieces 14 are inserted for ion treatment of those workpieces. The implantation system 10 includes a loadlock 20 for inserting workpieces into the plasma chamber 12. The loadlock 20 allows the plasma chamber 12 to be maintained at a reduced pressure (in relation to atmospheric pressure) as workpieces are moved into and withdrawn from the chamber 12 through a valve 21 that is opened and closed. A vacuum pump 22 maintains the chamber interior at a reduced pressure that is regulated by a valve 23 located between the chamber 12 and the pump 22.

The plasma chamber 12 depicted in FIG. 1 has inner walls that define a chamber interior 24 into which the workpieces 14 are inserted. The workpieces 14 are placed onto and removed from a generally planar conductive platen or support 30. The platen 30 may have any suitable dimensions depending on the size of the workpiece it must support.

An energy source 40 is located at one end of the generally cylindrical process chamber 12. The energy source 40 injects energy into the chamber 12 to produce an ion plasma inside the plasma chamber 12 in a region 42 between the energy source 40 and the wafer support 30. One example of a suitable energy source 40 is an rf coil operating at 13.5 Megahertz that transmits rf energy through a quartz plate 43 that bounds one end of the plasma chamber 12. Other coil energization frequencies are possible and, for example, could include frequencies of about 2.0 Megahertz. Rf energy entering the chamber 12 produces an ion plasma from gas molecules that are pumped into the plasma chamber from an external gas supply 44. The gas pressure in the chamber 12 is maintained in the range of 0.2 to 5.0 millitorr. As an example, Nitrogen gas can be routed into the chamber and ionized by rf energy entering the chamber from the rf coil. Application of this energy ionizes the gas molecules. Other techniques know for producing an ion plasma in the plasma chamber could be utilized while practicing the present invention.

Figure 2:
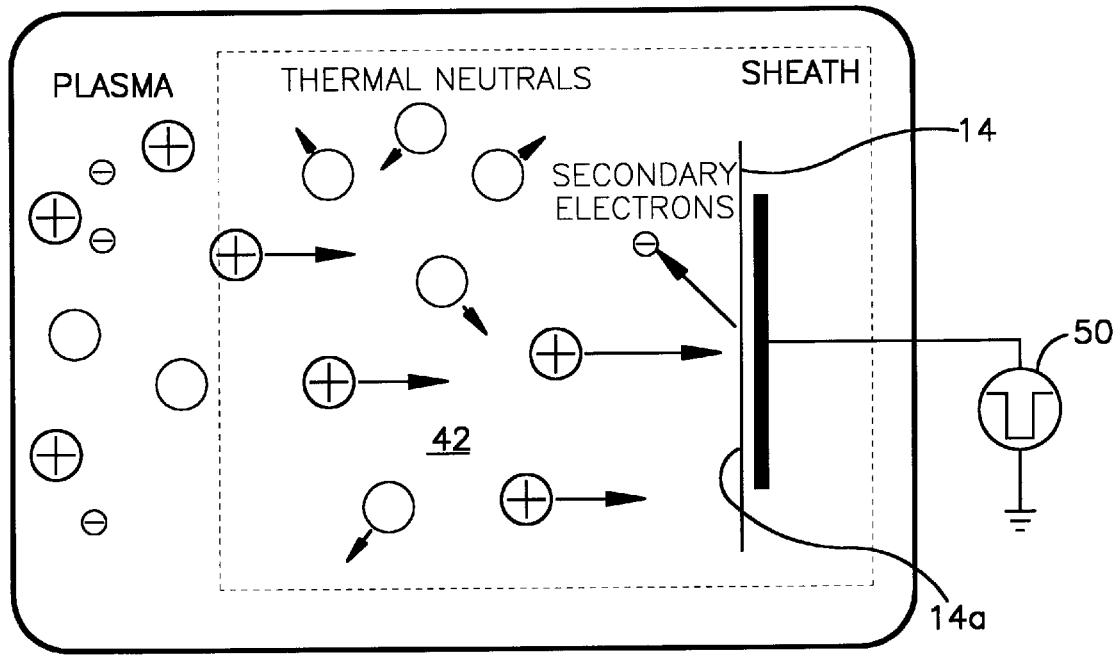
FIG. 2 is a schematic depiction of processes occurring at a wafer surface when ions strike that surface.

Once the ion plasma is set up in the region 42 between the support 30 and the quartz plate 43, the ions are accelerated into contact with the workpiece 14. In a preferred embodiment of the present invention, the workpiece is a silicon wafer, generally round in shape, that is placed onto the support 30. The workpiece support 30 is constructed from an electrically conductive material. The ions are positively charged so that application of an electric field of suitable magnitude and direction in the region of the plasma will cause the ions in the plasma to accelerate toward and impact the surface of the silicon wafers. As seen in FIG. 1, a modulator 50 supplies voltage pulses 52 (typically less than ten kilovolts) that relatively bias the conductive support 30 with respect to conductive inner walls of the chamber 12 to set up an appropriate electric field in the region 42. FIG. 2 schematically illustrates reactions occurring at a treatment surface 14a of a workpiece 14 as ions from the ion plasma region 42 strike the surface 14a. Of particular note in this figure, ions striking the surface 14a create secondary electrons in a region in front of the workpiece 14.

Once the wafers 14 are treated, they are removed from the plasma chamber 12 and taken to other processing stations where the treated wafers are further fabricated to form integrated circuits. Such ion treatment has been conducted on eight inch diameter silicon wafers with good uniformity. Ion implantation using structure similar to that shown in FIG. 1 has also been used to treat large surfaces for the fabrication of flat panel displays.

FIGS. 1a and 1b illustrate a conductive workpiece support 30 to which has been added several dosimetry cups 60 of the present invention. While any number of cups 60 may be used, four are shown. The cups 60 are placed so that a top plate 66 is even with the implantation surface of the workpiece. Ions accelerated toward the implantation surface enter an aperture 62 to be measured. The close proximity of the cups 60 to the workpiece 14 causes the amount of ions which enter the cups 60 to be representative of the amount of ions which are implanted in the workpiece. The dosimetry cup 60 provides a measurement of the total current incident a collecting surface of the dosimetry cup (shown as 69 in FIG. 3). This current value is then manipulated by the control unit 195 to determine a charge per square centimeter within the dosimetry cup and correspondingly on the surface of the workpiece 14. Use of four cups 60 spaced around the periphery of the support 30 yields dose data at four different locations.

Figure 3:
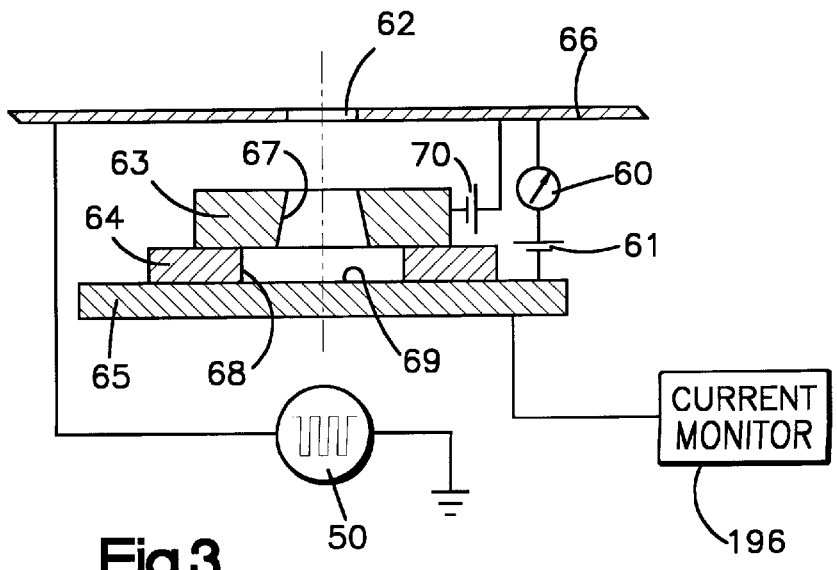
FIG. 3 is a section view of a Faraday Cup for measuring ion implantation current.

FIG. 3 is a more detailed depiction of a dosimetry cup 60 shown in cross section. The dosimetry cup has a generally cylindrical shape and includes the top plate 66, a top Faraday electrode 63, an insulator 64, and a bottom Faraday collecting plate 65. Dosimetry cups having other shapes such as sectors (not shown) disposed around the circumference of the implantation surface may also be used. The top plate 66 of the dosimetry cup is located at the same level as the implantation surface of the workpiece 14a (not shown in FIG. 3). The top plate 66 is electrically connected to the pulse generator 50 which is used to accelerate ions into the workpiece. Hence, the top plate 66 becomes electrically biased when the workpiece support 30 is biased by the pulse generator, thereby attracting plasma ions from the region 42 into the dosimetry cup 60.

The top Faraday electrode 63 is kept negatively biased relative to the top plate 66 by source 70. An appropriate negative bias is –200 V. The negative potential between the top plate 66 and the top Faraday electrode 63 prevents secondary electrons caused by ions striking the plate 65 from leaving the dosimetry cup 60 and also repels plasma electrons from entering the dosimetry cup 60, both of which may compromise the accuracy of the dosimetry cup measurement. The insulator 64 electrically isolates the top Faraday electrode 63 from the bottom Faraday collecting plate 65.

In this embodiment, the bottom Faraday collecting plate 65 is positively biased to 20 V relative to the top plate 66 by a voltage source 61. This positive bias prevents plasma ions from drifting into the collecting plate 65 in between pulses from pulse generator 50 and causing false registrations of ions by the dosimetry cup 60. When the pulse generator 50 applies a negative pulse to the workpiece support 30 and the top plate 66, the collecting plate 65 also becomes negative, in this embodiment the collecting plate is 20 volts more positive than the negative voltage (typically less than ten kilovolts) applied by the pulse generator.

Figure 4:
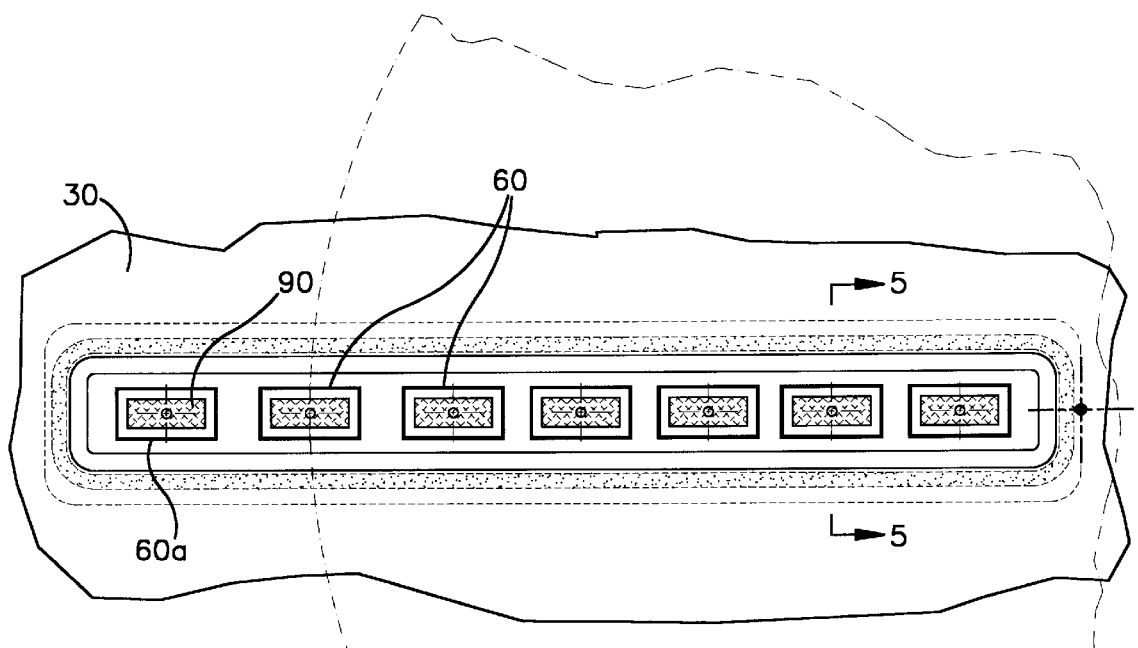
FIG. 4 is a elevation view of a structure supporting a linear array of dosimetry cups for monitoring ion dose.
Figure 5:
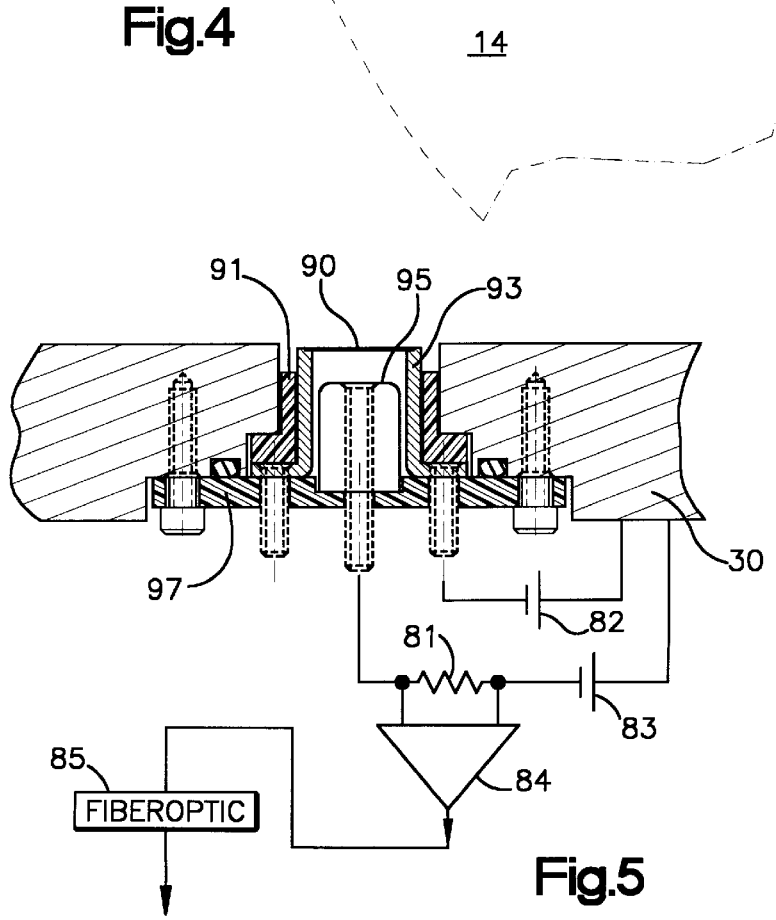
FIG. 5 is a section view of the FIG. 4 structure as seen from the plane 5—5 of FIG. 4.

Another embodiment of the present invention is depicted in FIGS. 4 and 5. In this embodiment, seven dosimetry cups 60 are arranged in an array as shown in FIG. 4. All of the dosimetry cups are used for calibration and set up procedures, while only an outermost dosimetry cup 60a is exposed to implantation during the processing of a workpiece 14. Referring now to FIG. 5, a suppression screen 90 mounted to a conductive electrode 93 is used (rather than an aperture electrode) serves as the entry point for ions. In this embodiment, the screen holes are 0.04 cm in diameter and the screen has a transparency of about one half.

A collector 95 is insulated from the workpiece support 30 by an insulator 91. The dosimetry cup 60 is insulated from the workpiece support 30 by insulator 97. The cup electrode 93 is held at −50 volts relative to the workpiece support 30 by a power supply 82. The collector 95 is held at +10 volts relative to the workpiece support 30 by power supply 83. A current monitor 84 measures the current from the collector 95 using a 100 ohm resistor 81. The current passing through the resistor 81 returns to the workpiece support 30. A high band-width fiberoptic pickup 85 transmits the current data to the control 195 (shown in FIG. 1.)

One use of the present invention is in controlling the proper duration of ion implantation of each workpiece 14 to be implanted. The workpiece dose calculated by control unit 195 is continuously compared to the desired dose by control unit 195. The control unit 185 is coupled to the modulator 50 and also to a current monitor 196. Integrating over the multiple pulses from the modulator yields the total charge and dividing by the area of the opening 62 yields the charge per area or dose. Once the dose level is satisfactory for a given wafer, the ion implantation process is suspended while a new wafer is placed into the chamber.

Heretofore, dosimetry cups were not sufficiently accurate in plasma immersion ion implantation due to drifting plasma ions entering the dosimetry cups and causing false readings. The present invention makes it possible to take advantage of dosimetry cups in plasma immersion technology.

While the present invention has been described with a degree of particularity, it is the intent that the invention include all modifications and alterations from the disclosed design falling within the spirit or scope of the appended claims.

We claim:

1. An ion implantation system for causing ions to impact an implantation surface comprising:

a) a process chamber defining a chamber interior into which one or more workpieces can be inserted for ion treatment;

b) an energy source for setting up an ion plasma within the process chamber;

c) a support for positioning one or more workpieces within an interior region of the process chamber so that an implantation surface of the one or more workpieces is positioned within the ion plasma;

d) a pulse generator in electrical communication with the workpiece support for applying electrical pulses for attracting ions to the support;

e) one or more dosimetry cups including an electrically biased ion collecting surface parallel to the implantation surface; and f) an implantation controller for monitoring signals from the one or more dosimetry cups to control ion implantation of the one or more workpieces.

2. The ion implantation system of claim 1 wherein the dosimetry cup further includes:

a) a negatively biased electrode to repel secondary electrons from the collecting surface and electrons from the plasma; and b) a positively biased ion collecting surface to repel plasma ions.

3. The ion implantation system of claim 1 wherein the one or more dosimetry cup have generally circular apertures.

4. The ion implantation system of claim 1 further including multiple dosimetry cups with apertures forming a sector ring shape.

5. The ion implantation system of claim 2 wherein the negatively biased electrode includes an aperture with a diameter based on a plasma parameter.

6. The ion implantation system of claim 5 wherein the plasma parameter is plasma sheath thickness at the negatively biased electrode surface.

7. The ion implantation system of claim 5 wherein the aperture of the negatively biased electrode is less than twice the plasma sheath thickness.

8. The ion implantation system of claim 2 wherein the negatively biased electrode is biased to approximately −200 V relative to the workpiece support.

9. The ion implantation system of claim 2 wherein the positively biased ion collecting surface is biased to approximately +20 V relative to the workpiece support.

10. The ion implantation system of claim 1 further comprising a metal screen having holes to allow ions to enter the dosimetry cups.

11. The ion implantation system of claim 10 wherein the screen hole size is 0.04 centimeters and the screen transparency is about one half.

12. The ion implantation system of claim 10 wherein the negatively biased electrode is biased to approximately −50 V relative to the workpiece support.

13. The ion implantation system of claim 10 wherein the positively biased ion collecting surface is biased to approximately +10 V relative to the workpiece support.

14. The ion implantation system of claim 1 wherein signals from the dosimetry cup that are used by the controller are derived from electric current through the collecting surface of the dosimetry cup.

15. The ion implantation system of claim 1 wherein the parameter of the ion implantation process controlled is the duration of the implantation of the workpiece.

16. The ion implantation system of claim 1 wherein the dosimetry cups are imbedded in the workpiece support to eliminate stray capacitance to ground thereby avoiding displacement current errors.

17. The ion implantation system of claim 1 wherein signals from the dosimetry cup are extracted by means of a high band-width fiber optic transmitter to prevent stray capacitance which could cause a displacement current error.

* * * * *